United States Patent
Yano et al.

(10) Patent No.: US 9,317,053 B2
(45) Date of Patent: Apr. 19, 2016

(54) VOLTAGE REGULATOR FOR A FLASH MEMORY

(71) Applicant: Winbond Electronics Corp., Taichung (TW)

(72) Inventors: Masaru Yano, Tokyo (JP); Hiroki Murakami, Saitama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 26 days.

(21) Appl. No.: 14/263,536

(22) Filed: Apr. 28, 2014

(65) Prior Publication Data

US 2015/0311354 A1 Oct. 29, 2015

(51) Int. Cl.
- *H01L 29/8605* (2006.01)
- *H01L 27/08* (2006.01)
- *G05F 1/575* (2006.01)
- *H01L 49/02* (2006.01)

(52) U.S. Cl.
CPC ............ *G05F 1/575* (2013.01); *H01L 27/0802* (2013.01); *H01L 28/20* (2013.01)

(58) Field of Classification Search
CPC ........................ H01L 29/8605; H01L 27/0802
See application file for complete search history.

(56) References Cited

U.S. PATENT DOCUMENTS

| | | | |
|---|---|---|---|
| 5,995,819 A | 11/1999 | Yamaji et al. | |
| 2013/0038385 A1* | 2/2013 | Kodera | ............... H01L 27/0802 327/540 |

FOREIGN PATENT DOCUMENTS

| | | |
|---|---|---|
| JP | 2004-140144 | 5/2004 |
| JP | 2010-109233 A | 5/2010 |
| JP | 2013-038234 | 2/2013 |
| TW | 201303544 A1 | 1/2013 |

* cited by examiner

*Primary Examiner* — Mamadou Diallo
(74) *Attorney, Agent, or Firm* — Muncy, Geissler, Olds & Lowe, P.C.

(57) ABSTRACT

The invention provides a voltage regulator. The voltage regulator (100) of the invention includes a comparison circuit (20) and a voltage divider circuit (110). The voltage divider circuit (110) has a PMOS transistor (T6) connected to a voltage source (VDD) and resistors (R1, R2, R3, R4, R5 and R6) serially connected between the transistor (T6) and a reference voltage. A feedback voltage generated from a node (N3) between resistors R4 and R5 is provided to the comparison circuit (20). In addition, a middle voltage (Vm) generated from a node (Nc) of the resistors is provided to a well region, so the parasitic capacitance is reduced.

15 Claims, 7 Drawing Sheets

US 9,317,053 B2

VOLTAGE REGULATOR FOR A FLASH MEMORY

CROSS REFERENCE TO RELATED APPLICATIONS

This application claims priority of Japan Patent Application No. 2013-254127, filed on Dec. 9, 2013, the entirety of which is incorporated by reference herein.

BACKGROUND OF THE INVENTION

1. Field of the Invention

The invention is related to a semiconductor device having a resistor divider circuit for dividing a resistor, and more particularly to a divider circuit used for a high-voltage generating circuit of a flash memory.

2. Description of the Related Art

In order to satisfy requirements of high speed and low power consumption, NAND type flash memory uses a low power supply. Therefore, flash memory uses a high-voltage generated inside of a chip when performing programming or delete operations. During the programming operation, an inner high-voltage generating circuit can generate about 30V, when it does not provide a stable high-voltage to a block with a heavy load (memory cell array). For generating such a high-voltage, a voltage regulator can use a voltage divider circuit with a high resistor element to reduce power consumption, and the sink current is reduced.

In the prior art, namely Japan Patent publication No. 2004-140114, a first output setting circuit is installed between a reference voltage and a feedback node, and a second output setting circuit is installed between the feedback node and an output terminal. When the output terminal is coupled to a load, switches for the first and second output setting circuits are off, current flows through the path of low resistor element of the voltage divider circuit, and the voltage of the feedback node changes quickly according to the load. Therefore, unstable operation of the circuit due to parasitic capacitance associated with the resistor element is prevented. In addition, Japan Patent publication No. 2013-38234 discloses a voltage divider circuit including a resistor R1 and a resistor R2 coupled in series, and the resistors R1 and R2 are formed by diffusion regions in the well of the semiconductor substrate. By connecting the voltage division node in the diffusion region of the resistor R1 to the well region of the resistor R2, the variable rate of difference of the resistors R1 and R2 is suppressed.

BRIEF SUMMARY OF THE INVENTION

FIG. 1 is a schematic diagram illustrating an embodiment of a conventional voltage regulator circuit. The voltage regulator 10 has a comparison circuit 20 and a voltage divider circuit 30 connecting to the comparison circuit 20. The comparison circuit 20 comprises PMOS transistors T1 and T2 connected to a voltage source VDD, NMOS transistors T3 and T4 serially connected to the PMOS transistors T1 and T2 respectively, and an NMOS transistor T5 commonly connected to the NMOS transistors T3 and T4. The gates of PMOS transistors T1 and T2 are connected to node N1 in common. The node N1 is further connected to a gate of a PMOS transistor T6 of a voltage divider circuit 30. A reference voltage Ref is provided to a gate of the transistor T3, and a voltage generated at a node N3 of the divider circuit 30 is provided to a gate of the transistor T4. An active signal Active is provided to a gate of the transistor T5, and the transistor T5 turns on when the comparison circuit 20 operates. The comparison circuit 20 compares a reference voltage Ref with a feedback voltage from the node N3, and reduces an output voltage of the node N1 when the feedback voltage at the node N3 is lower than the reference voltage Ref. Thereby, the current flowing through the transistor T6 is increased. On the other hand, the comparison circuit 20 raises the output voltage of the node N1 when the feedback voltage at the node N3 is higher than the reference voltage Ref. Thereby, the current flowing through the transistor T6 is decreased.

The voltage divider circuit 30 comprises a PMOS transistor T6 connected to the voltage source VDD, and resistors R1, R2, R3, R4, R5 and R6 serially connected between the transistor T6 and the reference potential (ex. ground potential). As shown in the figure, the node connected between the transistor T6 and the resistor R1 forms the output terminal Vout. In addition, the node N3 connected between the resistors R4 and R5 generates the feedback voltage, and the feedback voltage is provided to the gate of the transistor T4 in the comparison circuit 20. The voltage source VDD illustrated in this embodiment is intended to represent a voltage in a broad sense, and it may include a high-voltage. Therefore, a high-voltage can be generated from the output Vout.

In order to suppress the voltage dependence, the resistors are composed of conductive poly-silicon elements formed on the semiconductor substrate. The poly-silicon elements are formed on the surface of the semiconductor substrate through an insulating film such as a silicon oxide film, and the parasitic capacitance Cp is formed between the poly-silicon element and the semiconductor substrate for biasing the semiconductor substrate in the reference potential (ex. ground potential). The resistors R1-R6 are a high resistor for a small sink current. Finally, since an RC circuit is formed by the resistors R1-R6 and the parasitic capacitance Cp, the response time of the voltage divider circuit 30 is delayed. Further, the comparison circuit 20 requires an RC element between the node N1 and the node N2 to compensate for the phase margin, and the size of the RC element is increased depending on the parasitic capacitance Cp of the regulator feedback loop.

A semiconductor device of the present invention comprises a semiconductor substrate having a semiconductor region, and a resistor consisting of a conductive material formed via an insulation film on the semiconductor region. The resistor is supplied with a first voltage and a second voltage of a reference voltage. The semiconductor region is supplied with a middle voltage between the first voltage and the second voltage, and the middle voltage is generated by the resistor.

In a preferred embodiment, the middle voltage is (V1−V2/2) when the first voltage is V1 and the second voltage is V2. In a preferred embodiment, the middle voltage is variable when the first voltage is variable. In a preferred embodiment, the resistor is a poly-silicon layer doped with an impurity. In a preferred embodiment, the poly-silicon layer is electrically connected to the semiconductor region via a position where the middle voltage is generated. In a preferred embodiment, the poly-silicon layer comprises a first poly-silicon layer coupled to the first voltage and a second poly-silicon layer coupled to the second voltage, and the first poly-silicon layer and the second poly-silicon layer are electrically connected to the semiconductor region via a position where the middle voltage is generated. In a preferred embodiment, a diffusion region with high impurity density is formed in a region of the semiconductor region where the middle voltage is applied to. In a preferred embodiment, the diffusion region is electrically connected to a position of the resistor where the middle voltage is generated via a conductive member. In a preferred embodiment, the semiconductor region is a well region formed in the semiconductor substrate.

A semiconductor device of the present invention comprises a first well region, a second well region, a first diffusion region, a second diffusion region, a third diffusion region, a first conductive member, a second conductive member and a third conductive member. The first well region is a first conductivity type, and a second well region of a second conductivity type is formed in the first well region. The first diffusion region and the second diffusion region of the first conductivity type are formed in the second well region. The third diffusion region of the second conductivity type is coupled and formed between the first diffusion region and the second diffusion region in the second well region. The first conductive member applies a first voltage to the first diffusion region. The second conductive member applies a second voltage to the second diffusion region. The third conductive member is electrically connected to the first diffusion region, the second diffusion region and the third diffusion region. The semiconductor device has the function of using a first diffusion region and a second diffusion region as resistor.

In a preferred embodiment, the third member provides a middle voltage, between the first voltage and the second voltage, to the third diffusion region, and the middle voltage is generated by the first diffusion region and the second diffusion region. In a preferred embodiment, the middle voltage is (V1–V2/2) when the first voltage is V1 and the second voltage is V2.

A voltage regulator of the present invention comprises a voltage divider circuit comprising the above-mentioned semiconductor device, and a comparison circuit for receiving a feedback voltage divided by the resistor of the voltage divider circuit, comparing the feedback voltage with a reference voltage, and outputting a voltage to the voltage divider circuit corresponding to the result of the comparison. Further, a flash memory of the invention comprises the voltage divider circuit and the voltage regulator.

According to the present invention, the parasitic capacitance formed in the semiconductor region can be reduced by providing the middle voltage generated by resistor to the semiconductor region. Therefore, the response time of the semiconductor device can be improved.

DETAILED DESCRIPTION OF THE INVENTION

Figure 1:
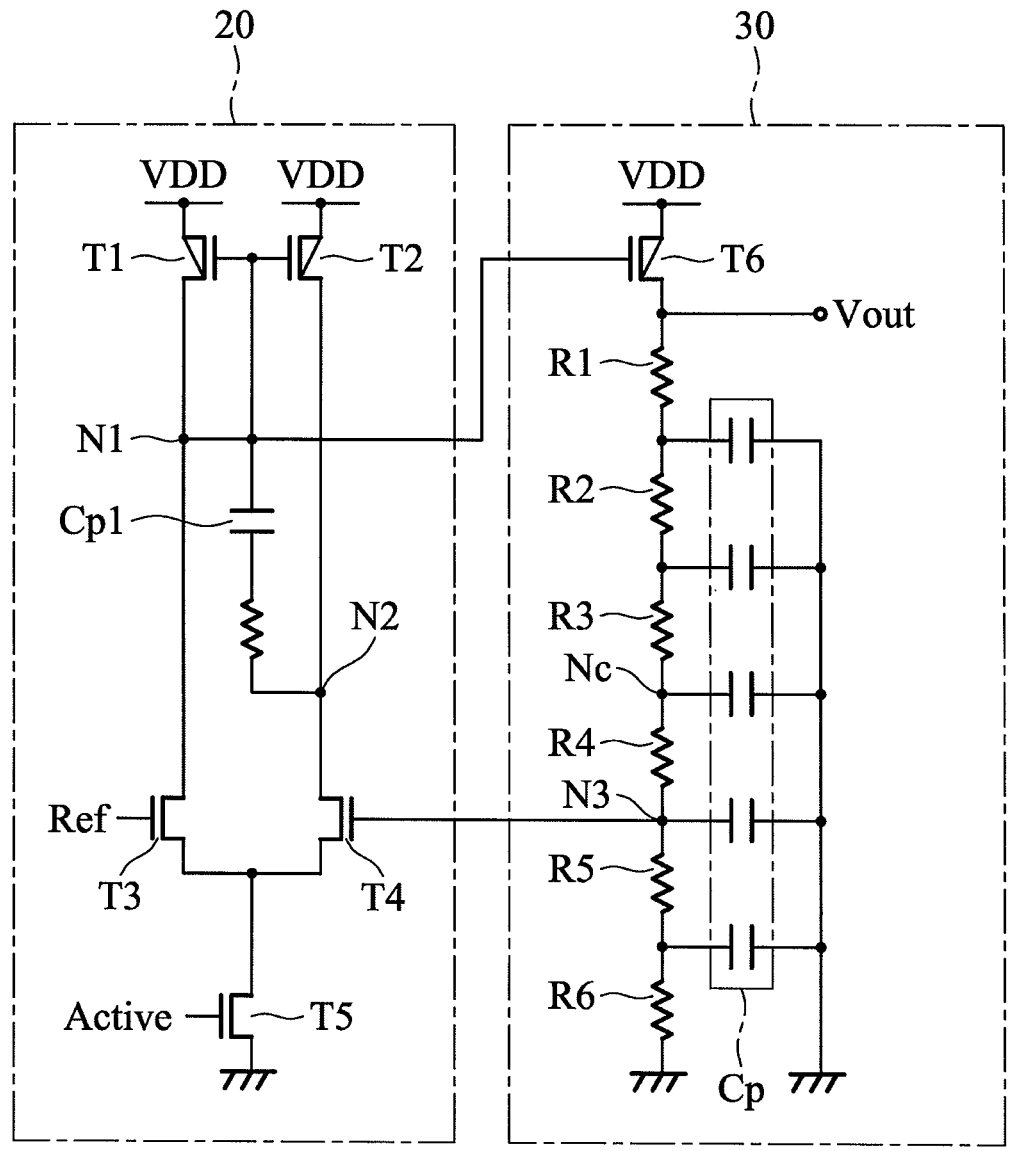
FIG. 1 is a circuit diagram illustrating an embodiment of a conventional voltage regulator for a flash memory.

Next, the embodiment of the invention will become more fully understood by referring to the following detailed description with reference to the accompanying drawings. A preferred embodiment of the present invention uses a voltage regulator formed by a semiconductor device as an example. For example, the voltage regulator is used in a high-voltage generation circuit for generating the voltage required to program and erase flash memory. Also, for easier identification, some portion shown in the drawings may be emphasized. Therefore, it should be noted that the scale of the drawings may not be the same as the actual device.

Figure 2:
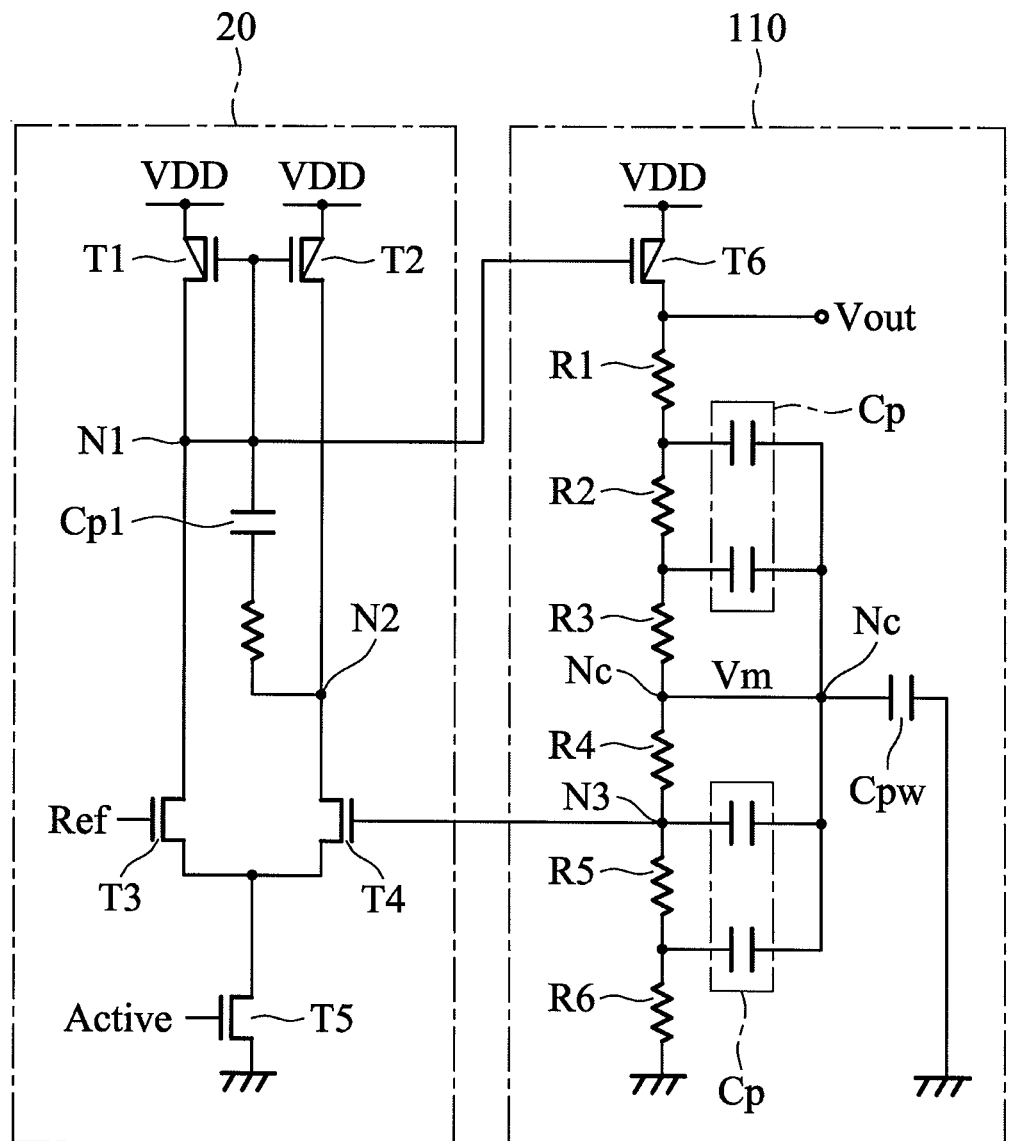
FIG. 2 is a schematic diagram illustrating a composition of a circuit of a voltage regulator according to the present invention.

FIG. 2 is a schematic diagram illustrating a circuit of a voltage regulator according to the present invention. In the embodiment, the voltage regulator 100 comprises a comparison circuit 20 and a voltage divider 110. Due to the comparison circuit 20 of the embodiment and the comparison circuit 20 in the prior art of FIG. 1 having substantially the same composition, they are marked with the same reference signs, and accordingly are not described further herein. In addition, the voltage source VDD illustrated in this embodiment represents a voltage in a broad sense, and it should be noted that the voltage provided by the voltage source VDD can be set as desired, and the voltage provided by the output terminal Vout can be set as desired. For example, the voltage source VDD and the output terminal Vout can comprise a high-voltage required to program and erase flash memory.

The divider circuit 110 comprises a PMOS transistor T6 connected to the voltage source VDD, and resistors R1, R2, R3, R4, R5 and R6 serially connected between the transistor T6 and the reference voltage (ex. ground). In order for easier description, it merely shows resistors R1, R2, R3, R4, R5 and R6 connected in series, but the resistor can be a single resistor element or any number of resistor elements. The node connected between the transistor T6 and the resistor R1 forms the output terminal Vout for connecting to a load. The node N3 connected between the resistors R4 and R5 generates a feedback voltage, and the feedback voltage is provided to the gate of the transistor T4 in the comparison circuit 20.

The resistors R1-R6 are composed of poly-silicon elements formed on the semiconductor substrate. The semiconductor substrate can be a P-type or N-type semiconductor substrate, for example, a silicon nitride film or a silicon oxide film is formed on the surface of the silicon substrate as an insulating film, and a poly-silicon layer serving as a resistor element is formed on the insulating film. Conductivity is applied to the poly-silicon element by doping impurities such as boron phosphorus or arsenic in the poly-silicon elements. The poly-silicon element can be processed into the desired shape by the well-known photolithography process.

The characteristic configuration of the embodiment is to supply the middle voltage Vm generated by a node Nc to the well region formed on the semiconductor substrate, and the node Nc set at a predetermined position between the resistors R1-R6. For example, the voltage from the voltage source VDD to the resistor R1 is V1, and the reference voltage connected to the resistor R6 is V2, so that the middle voltage Vm=(V1–V2)/2 is generated by the node Nc. If the reference voltage is 0V, the middle voltage Vm is V1/2. As shown in the figure, the node Nc connected between the resistors R3 and R4 generates the middle voltage Vm, and the well region is biased by the middle voltage Vm. In addition, the semiconductor substrate connected to the well region is biased by the reference voltage (ex. ground). It should be noted that the middle voltage Vm of (V1–V2)/2 is preferred, but it is not limited thereto.

Figure 3A:
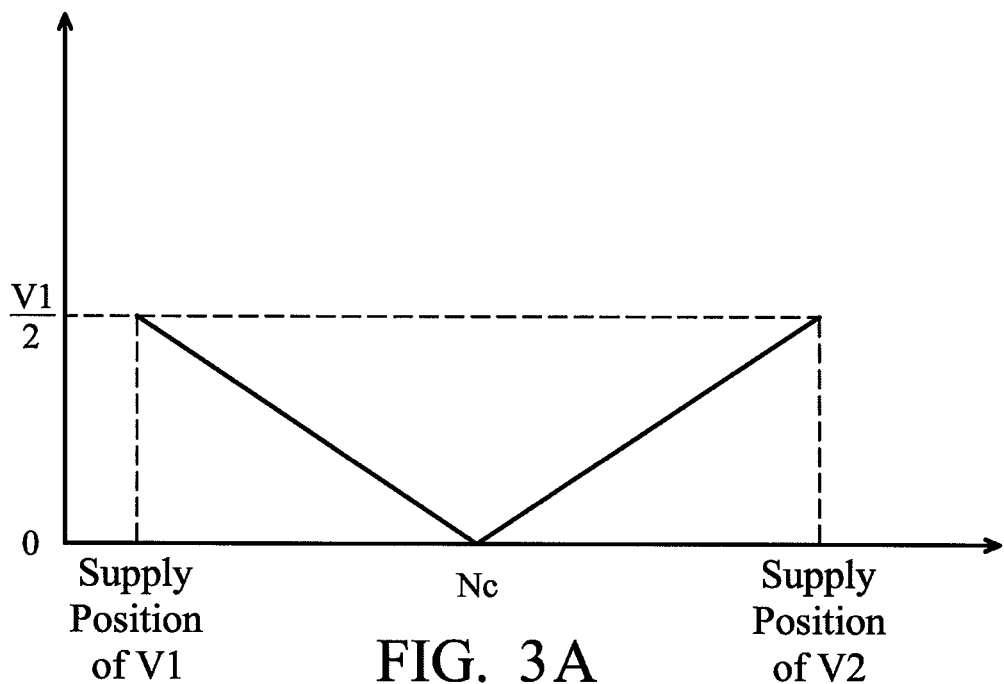
FIGS. 3A and 3B are schematic diagrams illustrating potential difference between the resistor and the well region.

FIG. 3A is a schematic diagram illustrating potential difference between the resistor and the well region. The vertical axis represents the potential difference, and the horizontal axis represents the position where the voltage drop of the resistor is caused. Here, the reference voltage V2 is the ground potential (0V), and a middle voltage Vm is V1/2. Because the well region is biased by the middle voltage Vm generated by the node Nc, the well region and the node Nc have the same potential, and the potential difference is zero. The voltage of the resistor increases from the node Nc toward the R3, R2 and R1, the potential difference between the well region and the resistor is the maximum at a position where the voltage V1 is supplied. Furthermore, the voltage of the resistor decreases from the node Nc toward the R4, R5 and R6, and the potential difference between the well region and the resistor is the maximum at a position where the voltage V2 is supplied.

Figure 3B:
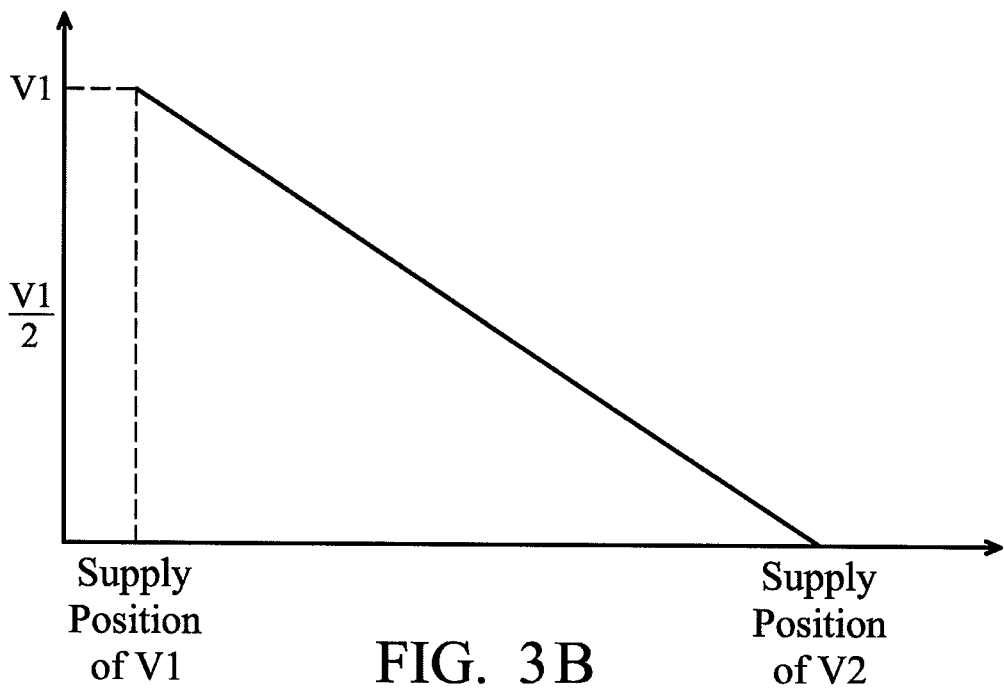

FIG. 3B is schematic diagram illustrating potential difference between the resistor and the well region of the voltage divider circuit 30 shown in FIG. 1. In the voltage divider circuit 30 of FIG. 1, because the well region is biased by GND (0V), the potential difference is the minimum (0V) at a position where the voltage V2 is supplied, and the potential difference is the maximum at a position where the voltage V1 is supplied. In the embodiment of the present invention, the well region is biased by the middle voltage Vm, so the maximum potential difference between the resistors can be suppressed at V1/2. Therefore, the parasitic capacitance Cp formed by the well region, the insulating film and the resistors can be smaller than the parasitic capacitance of the conventional voltage divider circuit 30 shown in FIG. 1.

Figure 4A:
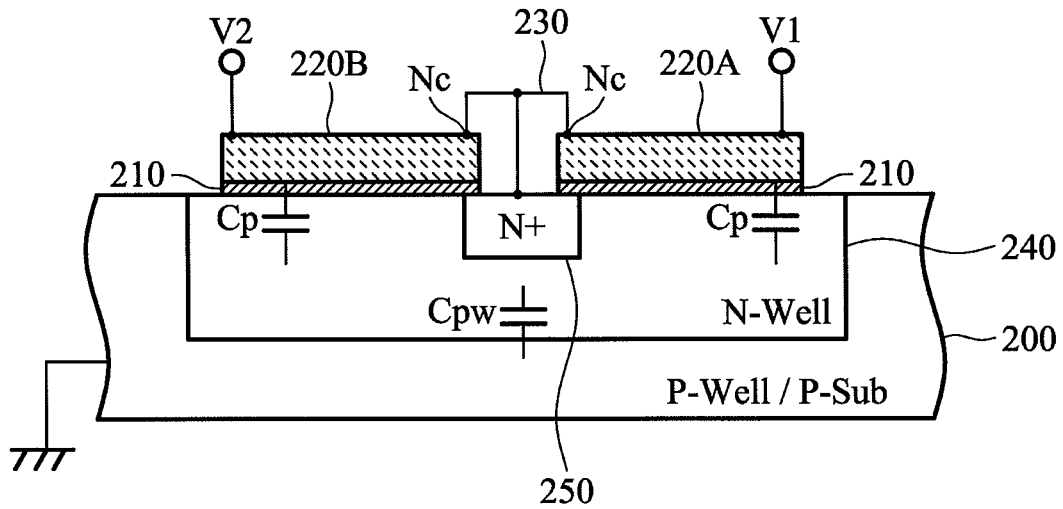
FIGS. 4A-4D are cross sectional views illustrating embodiments of the compositions of resistors for the voltage divider circuit according to the present invention.

FIGS. 4A-4D are diagrams illustrating embodiments of providing the middle voltage Vm to the well region. As shown in FIG. 4A, the silicon oxide film 210 is formed on the surface of the P-type silicon substrate or the well region 200 (P-well/ P-Sub), and an N-type or P-type poly-silicon layers 220A and 220B are formed on the silicon oxide film 210. The voltage V1 is provided from the transistor T6 to one end of the poly-silicon layers 220A. In addition, the voltage V2 is provided to one end of the poly-silicon layer 220B as a reference voltage. The other ends of the poly-silicon layers 220A and 220B form nodes Nc respectively, the nodes Nc are Ohmic-connected to the diffusion region 250 by the metal member 230, and the diffusion region 250 formed in the N-type well region 240 has high N-type impurity density. Therefore, the N-type well region 250 (N+) is biased by the middle voltage Vm. If the width and thickness of the poly-silicon layers 220A and 220B are the same, the length of poly-silicon layer 220A and 220B is substantially the same when their resistivity is the same.

Figure 4B:
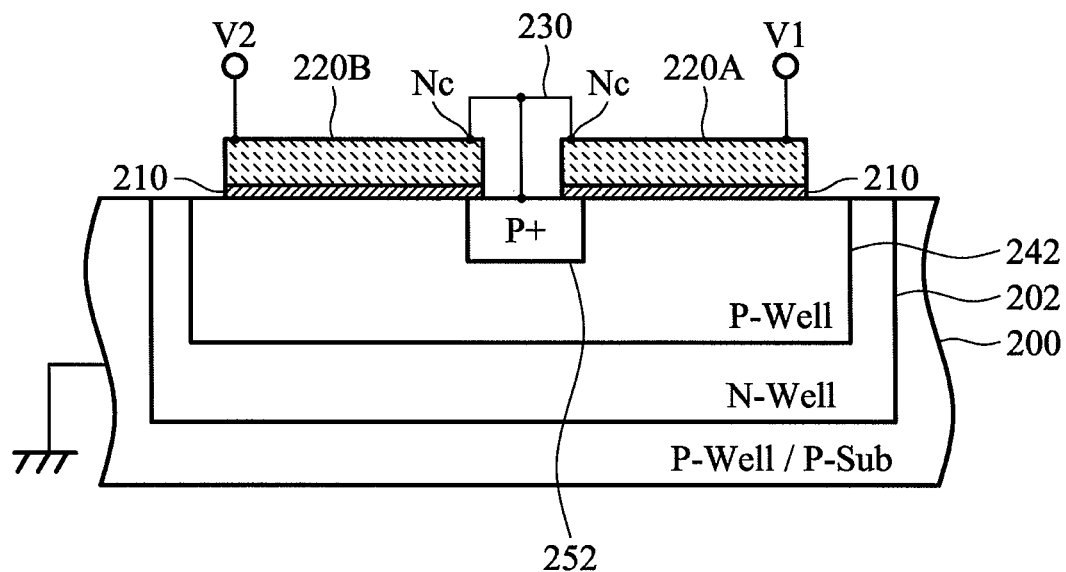

As shown in FIG. 4B, an N-type well region 202 is formed in the P-type silicon substrate or the P-type well region 200, and a P-type well region 242 is formed in the N-type well region 202. A diffusion region 252 with high P-type impurity density is formed on the P-type well region 242, the nodes Nc of the poly-silicon layers 220A and 220B are electrically connected to the diffusion region 252 (P+) by the metal member 230. Therefore, the P-type silicon substrate or the P-type well region 200 is connected to ground.

Figure 4C:
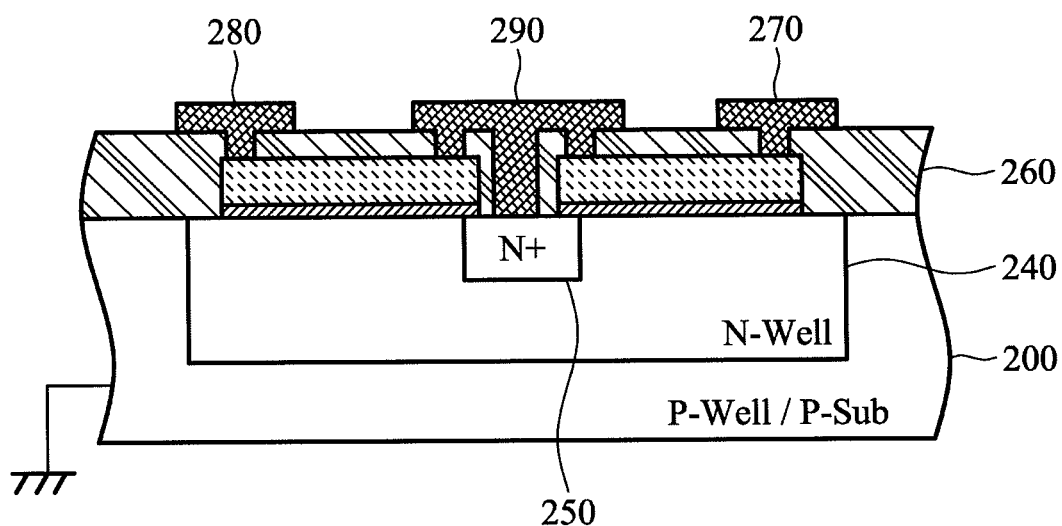

FIG. 4C shows an embodiment of a specific configuration of the voltage divider circuit of FIG. 4A. After the poly-silicon layers 220A and 220B are formed, an interlayer insulating film 260 on the entire surface of the substrate, and contact holes are formed at predetermined positions on the interlayer insulating film 260. Therefore, a metal layer 270 provided with the voltage V1 is connected to the poly-silicon layer 220A, and a metal layer 280 provided with the voltage V2 is connected to the poly-silicon layer 220B. In addition, the nodes Nc of the poly-silicon layers 220A and 220B are electrically connected to the diffusion region 250 (N+) by the metal layer 290.

Figure 4D:
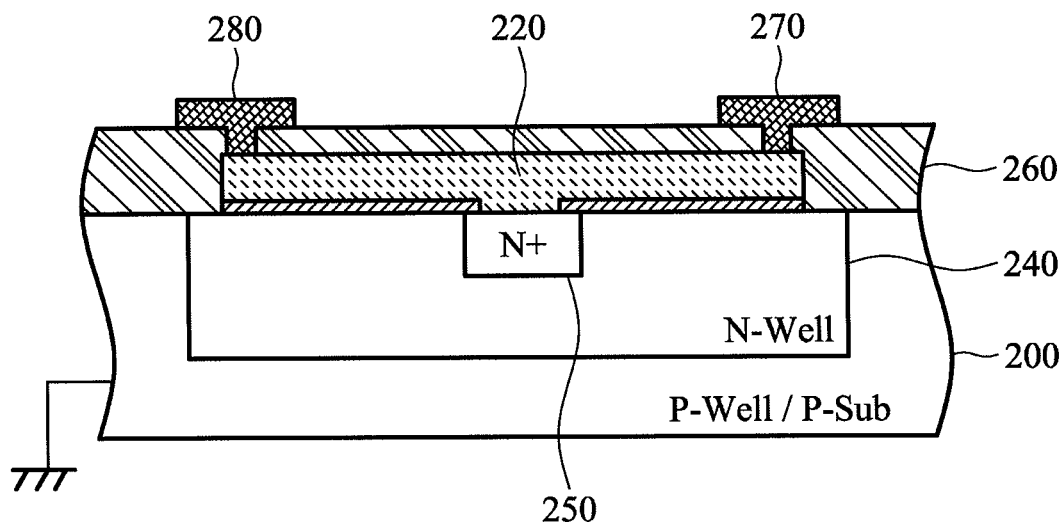

FIG. 4D shows an embodiment of a configuration of the references formed by a single poly-silicon layer 220. The poly-silicon layer 220 is electrically connected to the diffusion region 250 without being divided at a position corresponding to the node Nc, and there is no need for the metal layer 290 to connect the diffusion region 250 (N+) and the node Nc.

Figure 5:
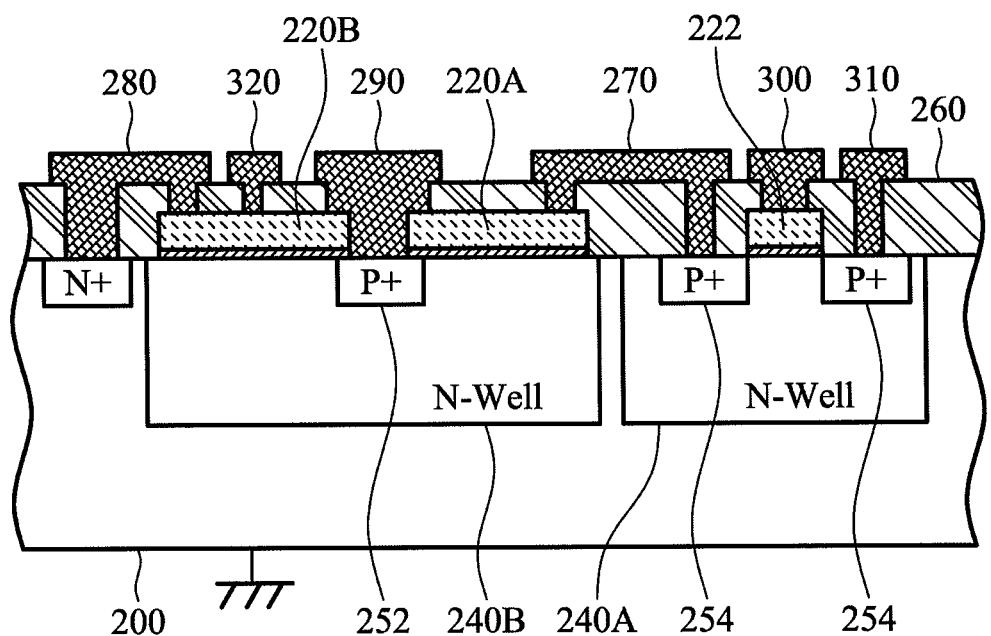
FIG. 5 is cross sectional view illustrating an embodiment of the composition of the voltage divider circuit according to the present invention.

FIG. 5 is cross sectional diagram illustrating an embodiment of the composition of the voltage divider circuit according to the present invention, the same compositions with the FIG. 4C are marked with the same reference signs. N-type well regions 240A and 240B are formed in the P-type silicon substrate 200. P-type diffusion region 254 of the source/gate of the transistor T6 is formed in the N-type well region 240A, and a poly-silicon gate 222 is formed on the N-type well region 240A by a gate oxide film. The P-type diffusion region 252 formed in the well region 240B is electrically connected to the node Nc for generating a middle voltage Vm of the resistors, and two poly-silicon layers 220A and 220B are formed on the well region 240B by the insulating film. The insulating film can be formed simultaneously with the gate oxide film, and the poly-silicon layers 220A and 220B can be formed simultaneously with the poly-silicon gate 222. An interlayer insulating film 260 is formed to cover the poly-silicon gate 222, the poly-silicon layers 220A and 220B, and the metal layers 270,280,290,300,310 and 320 are formed through a contact hole of the interlayer insulating film 260. The metal layer 310 is electrically connected to the voltage source VDD, and the metal layer 300 is electrically connected to the node N1 of the comparison circuit 20. In addition, the metal layer 270 is connected to the resistor R1 and the transistor T6, and provides an output Vout. The metal layer 290 provides the middle voltage Vm generated by the node Nc of the poly-silicon layers 220A and 220B to the well region 240B through the diffusion region 252. The metal layer 320 provides the feedback voltage of the node N3 to the gate of the transistor T4 of the comparison circuit 20. The metal layer 280 connects the poly-silicon layer 220B to the reference voltage V2 (GND).

According to the present embodiment, since the middle voltage Vm generated by the resistors is applied to the well region where the parasitic capacitance Cp is formed by the resistors, the parasitic capacitance Cp can be reduced in comparison with the case of the well region being biased by the reference potential. Therefore, the parasitic load element of the regulator feedback loop is reduced, the elements for the phase compensation are reduced, and the response time of the voltage regulator is improved.

Figure 6:
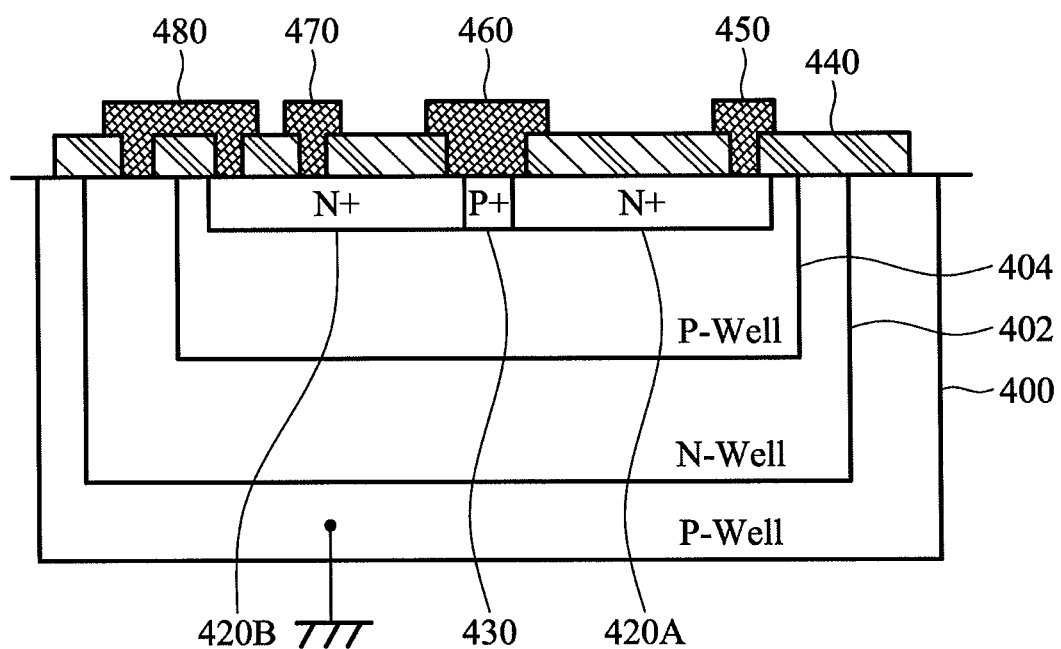
FIG. 6 is cross sectional view illustrating another embodiment of the composition of resistors for the voltage divider circuit according to the present invention.

Next, the other embodiments of the present invention are described. In the embodiment described above, the poly-silicon layer is used as a resistor, but a diffusion region formed in the silicon substrate is used as a resistor in other embodiments. FIG. 6 is a cross sectional view illustrating a main part of the voltage divider circuit according to another embodiment.

As shown in the figure, the N-type well region 402 is formed on the P-type well region or P-type silicon substrate 400, the P-type well region or P-type silicon substrate 400 is biased by GND. A P-type well region 404 is further formed in the well region 402. In the well region 404, N-type diffusion regions 420A and 420B are formed apart, and the P-type diffusion region 430 is formed and connected between the diffusion region 420A and 420B. The N-type diffusion regions 420A and 420B serve as resistors, and the diffusion region 430 serves as a contact region for biasing the middle voltage Vm to the well region 404. The insulating film 440 is formed on the surface of the substrate, and the contact holes of the diffusion regions 420A, 420B, 430, and the well region 404 are formed on the predetermined portions of the insulating film 440. The conductive member 450 is electrically connected to the diffusion region 420A via the contact hole, and provides a voltage V1 to the diffusion region 420A. The conductive member 460 is electrically connected to the N-type diffusion region 420A, 420B and the P-type diffusion region 430 at the positions corresponding to the nodes Nc. As a result, the middle voltage Vm generated by the node Nc biases the P-type well region 404 through the diffusion region 430. The conductive member 470 is connected to the diffusion region 420B at the position corresponding to the node N3, and provides the feedback voltage to the comparator circuit 20. The conductive member 480 connects the diffusion region 420B to GND.

If the resistor is formed by the diffusion region, the parasitic capacitance is formed in the PN junction of the diffusion region. However, in the present embodiment, the parasitic capacitance can be reduced by biasing the middle voltage Vm to the well region 404. As a result, a delay in the response time of the voltage divider circuit can be suppressed.

The above embodiment being a more preferred example, the well region for forming a voltage divider circuit is biased by the middle voltage Vm of ½ of the regulation voltage level, and the parasitic capacitance is reduced. However, the middle voltage Vm provided to the resistors can be set to any value between the reference voltages V1 and V2, and is not necessarily limited to ½.

In another preferred embodiment, it is possible to change the magnitude of the output Vout. For example, the output Vout can be changed by changing the voltage of the voltage source VDD. The voltage supplied from the voltage source VDD can be changed by using the circuit to switch the resistor value connected to the voltage source VDD. At this time, it is possible to change the middle voltage Vm at the same time. For example, by selectively connecting the bias resistor to the node Nc, it is also possible to change the middle voltage Vm of the node Nc.

Figure 7:
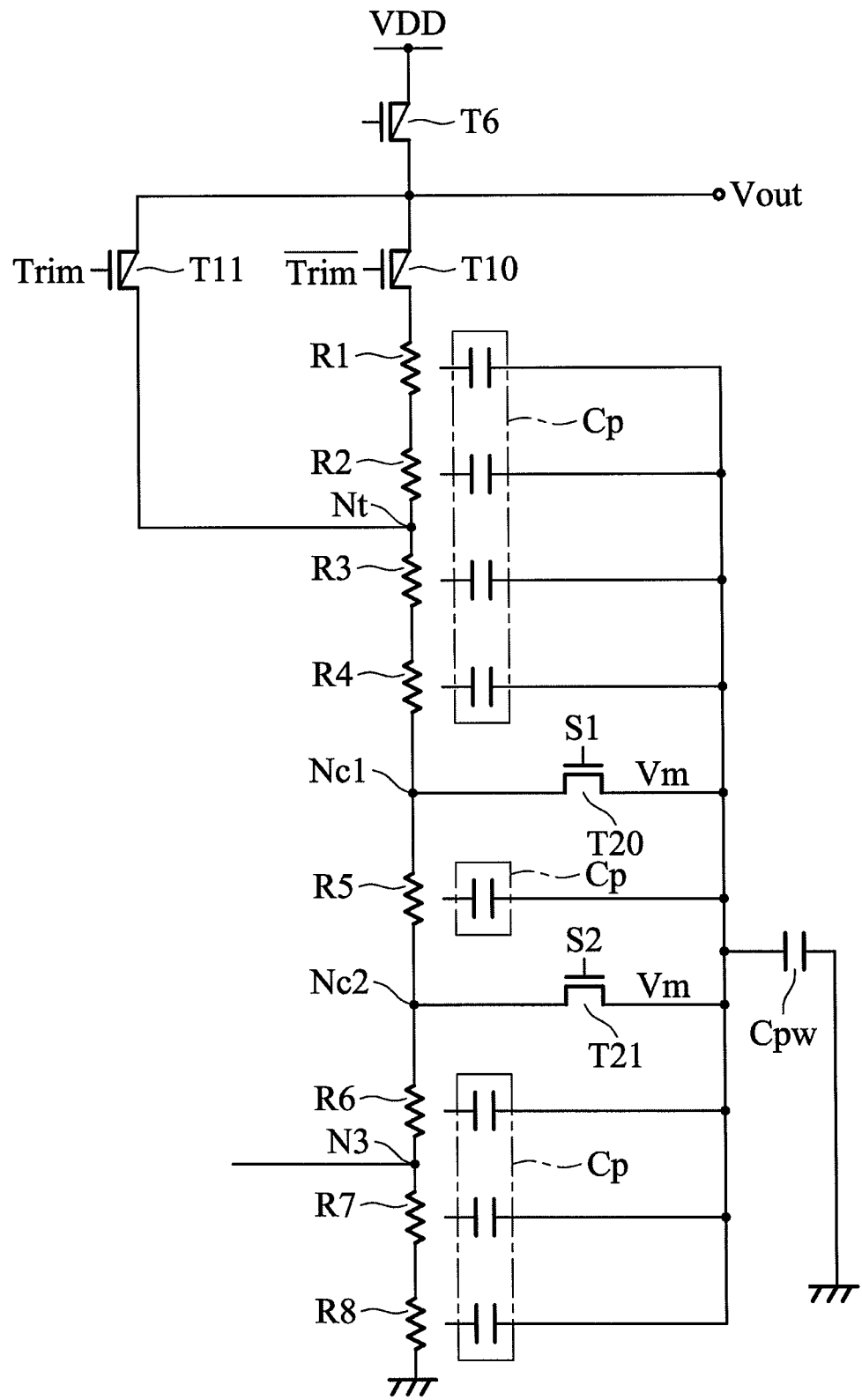
FIG. 7 is cross sectional view illustrating another embodiment of the composition of the voltage divider circuit according to the present invention.

FIG. 7 is cross sectional view illustrating another preferred embodiment of the voltage divider circuit. The P-type transistor T10 is connected in series between the resistor R1 and the output Vout, and the P-type transistor T11 is connected in series to the output Vout and the node Nt between the resistors R2 and R3. The gates of transistors T10 and T11 are connected to complementary signals Trim and /Trim for controlling the trimming of the output Vout. When the transistor T10 is turned on by the signal Trim, the transistor T11 is turned off. Conversely, when the transistor T10 is turned off, the transistor T11 is turned on. When the transistor T10 is turned on, the output Vout is connected to the resistors R1-R8. When the transistor T11 is turned on, the output Vout is connected to the resistors R3-R8.

Further, NMOS transistor T20 is connected between the well region and a node Nc1, and the node Nc1 is between the resistors R4 and R5. NMOS transistor T21 is connected between the well region and a node Nc2, and the node Nc2 is between resistors R5 and R6. The gates of transistors T20 and T21 are connected to selection signal S1 and S2 respectively. When the signal Trim is at a high level (namely, the transistor T10 is turned on, and the output Vout is connected to the resistors R1-R8), the signal is at high level, the signal S2 is at a low level, the transistor T20 is turned on, and the transistor T21 is turned off. Therefore, the node Nc1 is closed, the middle voltage Vm becomes Vm1, and the Vm1 is provided to the well region. At this time, the potential of Vm1 is the output Vout/2. On the other hand, when the signal Trim is at low level (namely, the transistor T11 is turned on, and the output Vout is connected to the resistors R3-R8), the signal S1 becomes low level, the signal S2 is at high level, the transistor T20 is turned off, and the transistor T21 is turned on. Therefore, the node Nc2 is shorted, the middle voltage Vm becomes Vm2, and the Vm2 is provided to the well region. At this time, the potential of Vm2 is the output Vout/2.

Further, in the above embodiments, the voltage divider circuit is utilized in the voltage regulator as an example, but the voltage divider circuit of the present embodiment can be utilized in circuits that require a desired voltage other than the voltage regulator of the semiconductor device. For example, it can be utilized in the high-voltage generating circuit for generating an erase voltage and a program voltage for the flash memory.

While the invention has been described by way of example and in terms of preferred embodiment, it is to be understood that the invention is not limited thereto. Therefore, the scope of the present invention shall be defined and protected by the following claims and their equivalents.

What is claimed is:

1. A semiconductor device, comprising:
 a semiconductor substrate, having a semiconductor region; and
 a resistor, consisting of a conductive material formed via an insulation film on the semiconductor region,
 wherein the resistor is supplied with a first voltage and a second voltage of a reference voltage, the semiconductor region is supplied a middle voltage between the first voltage and the second voltage, and the middle voltage is generated by the resistor.

2. The semiconductor device of claim 1, wherein when the first voltage is V1 and the second voltage is V2, the middle voltage is (V1−V2/2).

3. The semiconductor device of claim 1, wherein when the first voltage is variable, the middle voltage is variable.

4. The semiconductor device of claim 1, wherein the resistor is a poly-silicon layer doped with an impurity.

5. The semiconductor device of claim 4, wherein the poly-silicon layer is electrically connected to the semiconductor region via a position where the middle voltage is generated.

6. The semiconductor device of claim 4, wherein the poly-silicon layer comprises a first poly-silicon layer coupled to the first voltage and a second poly-silicon layer coupled to the second voltage, and the first poly-silicon layer and the second poly-silicon layer are electrically connected to the semiconductor region via a position where the middle voltage is generated.

7. The semiconductor device of claim 1, wherein a diffusion region with high impurity density is formed in a region of the semiconductor region where the middle voltage is applied to.

8. The semiconductor device of claim 7, wherein the diffusion region is electrically connected to a position of the resistor where the middle voltage is generated via a conductive member.

9. The semiconductor device of claim 1, wherein the semiconductor region is a well region formed in the semiconductor substrate.

10. A voltage divider circuit, comprising the semiconductor device of claim 1.

11. A voltage regulator, comprising:
 a voltage divider circuit, comprising the semiconductor device of claim 1; and
 a comparison circuit, receiving a feedback voltage divided by the resistor of the voltage divider circuit, comparing the feedback voltage with a reference voltage, and outputting a voltage to the voltage divider circuit corresponding to the result of the comparison.

12. A flash memory, comprising: the semiconductor device of claim 1.

13. A semiconductor, having a function of using a first diffusion region and a second diffusion region as a resistor, comprising:
- a first well region, having a first conductivity type;
- a second well region, having a second conductivity type, and formed in the first well region;
- the first diffusion region and the second diffusion region, having the first conductivity type, and formed in the second well region;
- a third diffusion region, having the second conductivity type, formed in the second well region, and coupled and formed between the first diffusion region and the second diffusion region;
- a first conductive member, applying a first voltage to the first diffusion region;
- a second conductive member, applying a second voltage to the second diffusion region; and
- a third conductive member, electrically connected to the first diffusion region, the second diffusion region and the third diffusion region.

14. The semiconductor device of claim 13, wherein the third member provides a middle voltage between the first voltage and the second voltage to the third diffusion region, and the middle voltage is generated by the first diffusion region and the second diffusion region.

15. The semiconductor device of claim 14, wherein when the first voltage is V1 and the second voltage is V2, the middle voltage is (V1−V2/2).

* * * * *